(12) United States Patent
Ye et al.

(10) Patent No.: US 6,509,772 B1
(45) Date of Patent: Jan. 21, 2003

(54) FLIP-FLOP CIRCUIT WITH TRANSMISSION-GATE SAMPLING

(75) Inventors: Yibin Ye, Hillsboro, OR (US); Zhanping Chen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/694,553

(22) Filed: Oct. 23, 2000

(51) Int. Cl.[7] ............................................. H03K 3/356
(52) U.S. Cl. ........................ 327/211; 327/218; 327/219
(58) Field of Search ................. 327/199, 202, 327/203, 208, 210, 211, 212, 214, 215, 218, 219, 223, 261, 288, 285, 398, 399, 401; 326/57–58; 377/77–80

(56) References Cited

U.S. PATENT DOCUMENTS

| | | | | |
|---|---|---|---|---|
| 3,993,916 A | * | 11/1976 | Copeland, III et al. | 377/79 |
| 4,709,173 A | * | 11/1987 | Nishimichi et al. | 326/57 |
| 5,239,206 A | * | 8/1993 | Yanai | 327/202 |
| 5,257,223 A | * | 10/1993 | Dervisoglu | 327/203 |
| 5,576,645 A | * | 11/1996 | Farwell | 327/211 |
| 5,619,157 A | * | 4/1997 | Kumata et al. | 327/203 |
| 5,774,005 A | * | 6/1998 | Partovi et al. | 327/210 |
| 5,831,462 A | * | 11/1998 | Witt et al. | 327/199 |

* cited by examiner

*Primary Examiner*—Terry D. Cunningham
*Assistant Examiner*—Long Nguyen
(74) *Attorney, Agent, or Firm*—Schwegman, Lundberg, Woessner & Kluth P.A.

(57) ABSTRACT

A flip-flop circuit comprising a first stage having a transmission gate to receive a data signal from an input node, and a second stage connected to the first stage, the second stage having another transmission gate to transfer the data signal to a memory unit, wherein the memory unit provides complementary output signals.

11 Claims, 12 Drawing Sheets

US 6,509,772 B1

FLIP-FLOP CIRCUIT WITH TRANSMISSION-GATE SAMPLING

TECHNICAL FIELD OF THE INVENTION

The present invention relates generally to sequential circuits, and in particular to a flip-flop.

BACKGROUND OF THE INVENTION

Flip-flops have many uses in today's computers and digital circuits. Flip-flops are one of the most commonly used elements to implement sequential circuits, in which the primary output relies not only on the current values of the inputs, but also on the previous input values. A flip-flop is used to generate a steady state output signal having either a high (logical one) or a low (logical zero) potential.

A prior art flip-flop 100 is shown in FIG. 1. Flip-flop 100 receives a clock signal CK and a data signal D to produce signals Q and Q*. Signals CK and D provide inputs to the gates of a stack of series-connected transistors, which include p-channel transistors P1 and P2 and n-channel transistors N1 and N2. When the signal level of CK signal is low, P1 and N1 turn on, allowing signal D to propagate to node Y. Node Y connects to a transmission gate TG. When the signal level at CK signal is high, TG turns on, allowing the signal at node Y to pass to node L and subsequently become output signal Q and Q*.

One problem involved with flip-flop 100 is the speed of data signal D propagating to node Y when signal D is at a high level, because note Y has to be precharged through the series-connected transistors P1 and P2. Another problem associated with flip-flop 100 includes an issue of charge sharing, which occurs when transistor P1 and N1 are off. When P1 and N1 are off, if data signal D changes from a high level to a low level; this low level activates transistor P2, however, since P1 is off, the charge stored at node PP is shared by node Y. The charge sharing, sometimes, introduces inefficiency to the operation of flip-flop 100 by slowing it.

For the reasons stated above, and for other reasons stated below which will become apparent to those skilled in the art upon reading and understanding the present specification, there is a need in the art for an improved flip-flop which can operate faster and has no charge sharing issue.

DETAILED DESCRIPTION OF THE INVENTION

The following detailed description refers to the accompanying drawings which form a part hereof, and shows by way of illustration specific embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the invention is defined only by the appended claims.

Figure 1:
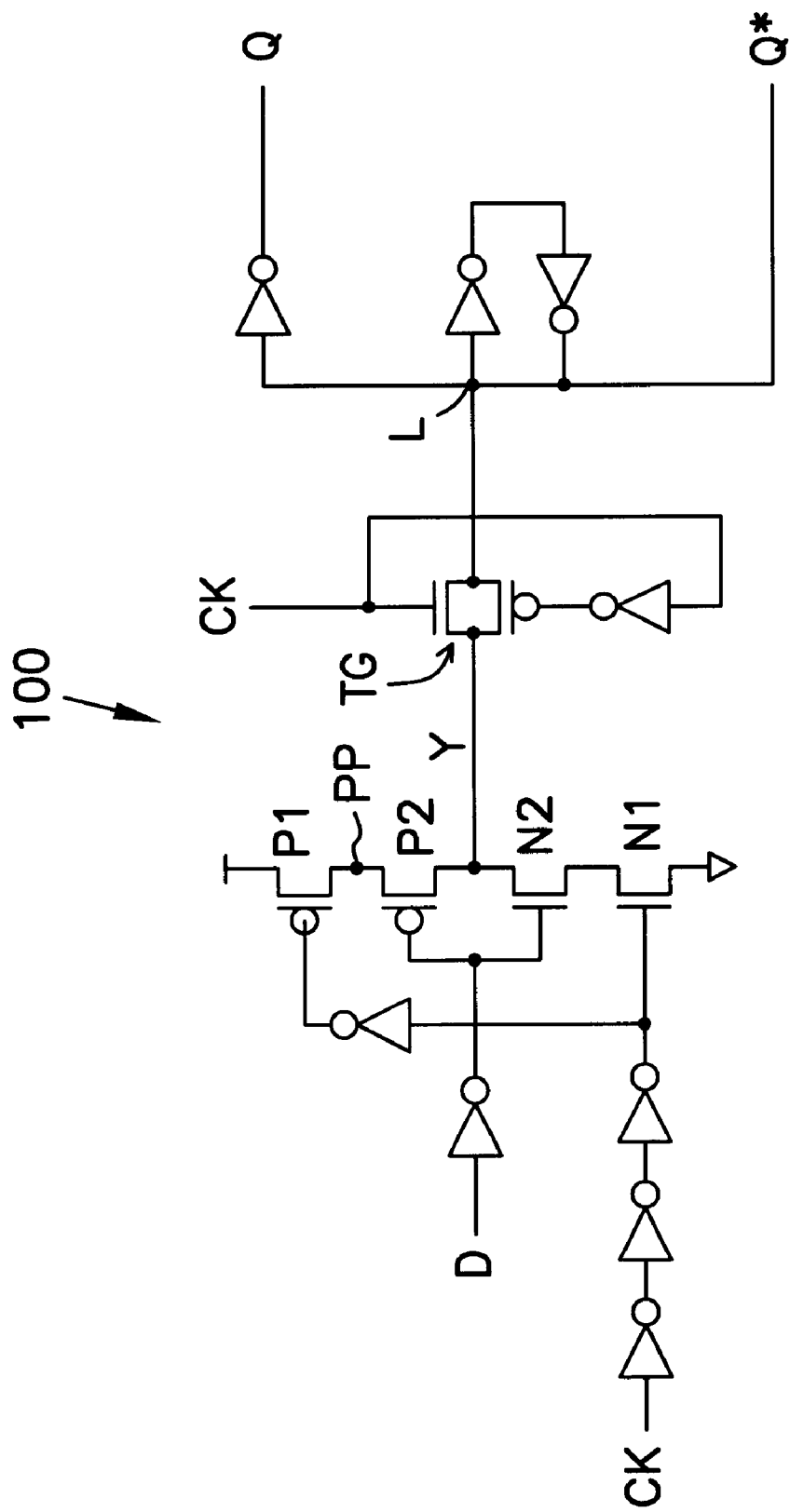
FIG. 1 is a flip-flop according to prior art.
Figure 2A:
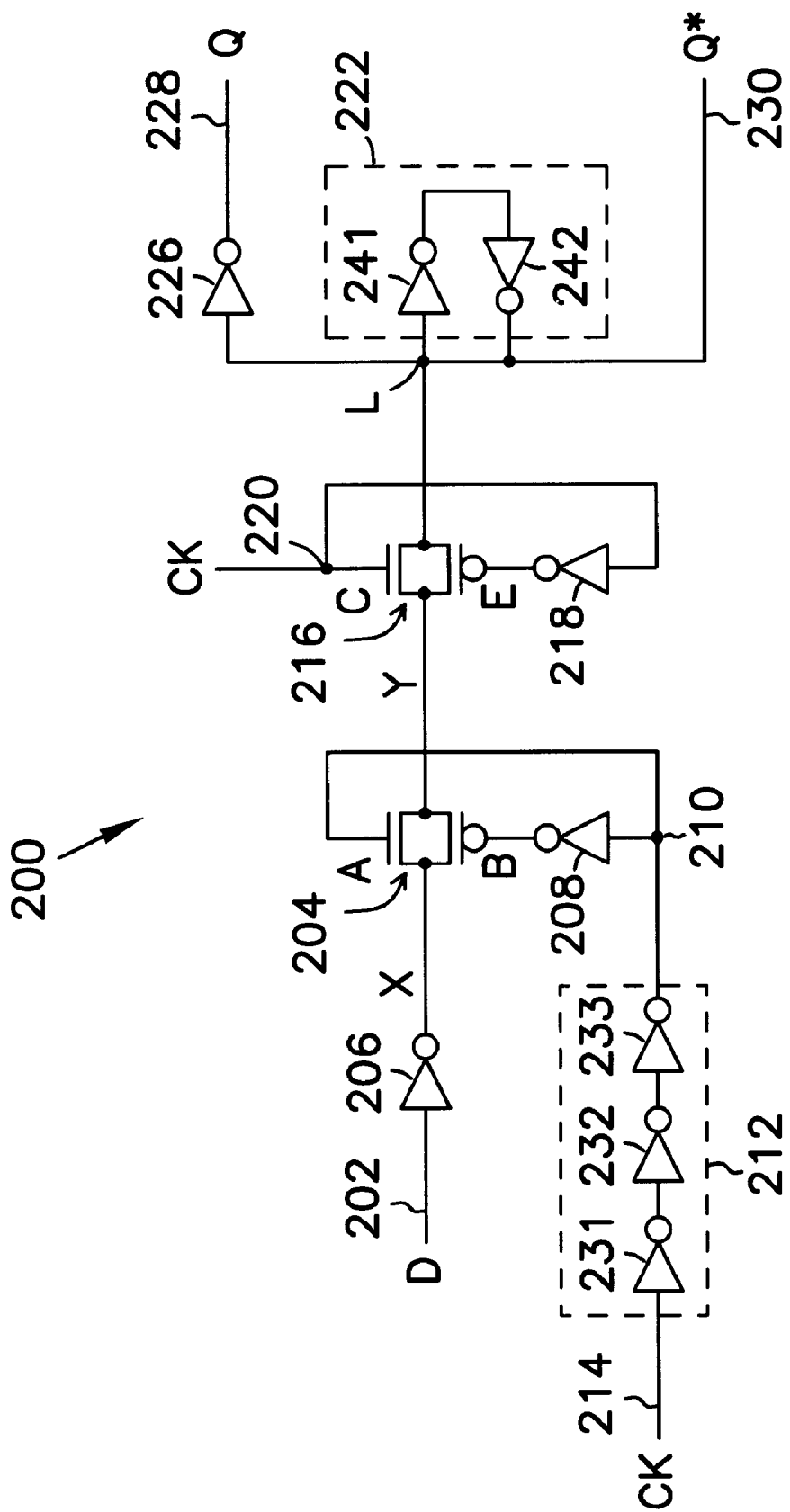
FIG. 2A is a flip-flop according to one embodiment of the invention.

FIG. 2A is a flip-flop according to one embodiment of the invention. Flip-flop 200 includes a data input node 202. Input node 202 receives an input data signal D. A first pass element or transmission gate 204 connects to input node 202 through an inverter 206 at node X. Transmission gate 204 has a first gate A and a second gate B. Gates A and B are connected to each other through an inverter 208 at node 210. Node 210 connects to a delay circuit 212. Delay circuit 212 connects to node 214 which receives a clock signal CK. Clock signal CK provides control signal to transmission gate 204 through gates A and B. Transmission gate 204 connects, in series, to a second pass element or transmission gate 216 at an internal node Y. Transmission gate 216 has a first gate C and a second gate E. Gates C and E are connected to each other through an inverter 218 at node 220. Node 220 also receives the same clock signal CK. Thus, clock signal CK also provides control signal to transmission gate 216 through gates C and E. Transmission gate 216 connects to a memory unit 222 at a latch node L. Latch node L provides an output signal Q to an output node 228 through an inverter 226. Latch node L of memory unit 222 also provides another output signal Q* at another output node 230.

In FIG. 2A, delay circuit 212 includes a plurality of inverters 231, 232 and 233 connected in series. However, in some other embodiments, delay circuit 212 can have only one inverter; or it can have five series-connected inverters. In general, delay circuit 212 can have any odd number of inverters. Furthermore, delay circuit 212 can include any conventional logic circuit elements such as NAND or NOR gates. In short, delay circuit 212 can be constructed in any way such that a time delay generated by the delay circuit meets the timing operation of flip-flop 200.

In FIG. 2A, memory unit 222 includes inverters 241 and 242 connected back-to-back. However, in some other embodiments, memory unit 222 can be constructed from any conventional elements which can hold or store a charge or a voltage potential of a signal. For example, memory unit 222 can be a memory cell such as dynamic random access memory (DRAM), static random access memory (SRAM), programmable memory or other types of memory.

In FIG. 2A, each of the transmission gates 204 and 216 is controlled by different signal levels of the clock signal CK. Transmission gate 204 is turned on by a low signal level of CK signal. Transmission gate 216 is turned on by the high signal level of the CK signal. When CK signal makes a transition from low to high (rising edge of CK signal), the data signal at latch node L follows the data signal at internal node Y. Thus, flip-flop 200 is a positive-edge-triggered flip-flop. However, flip-flop 200 can be rearranged to be a negative-edge-triggered flip-flop by switching the positions of n-channel and p-channel transistors within each of the transmission gates 204 and 216.

Figure 2B:
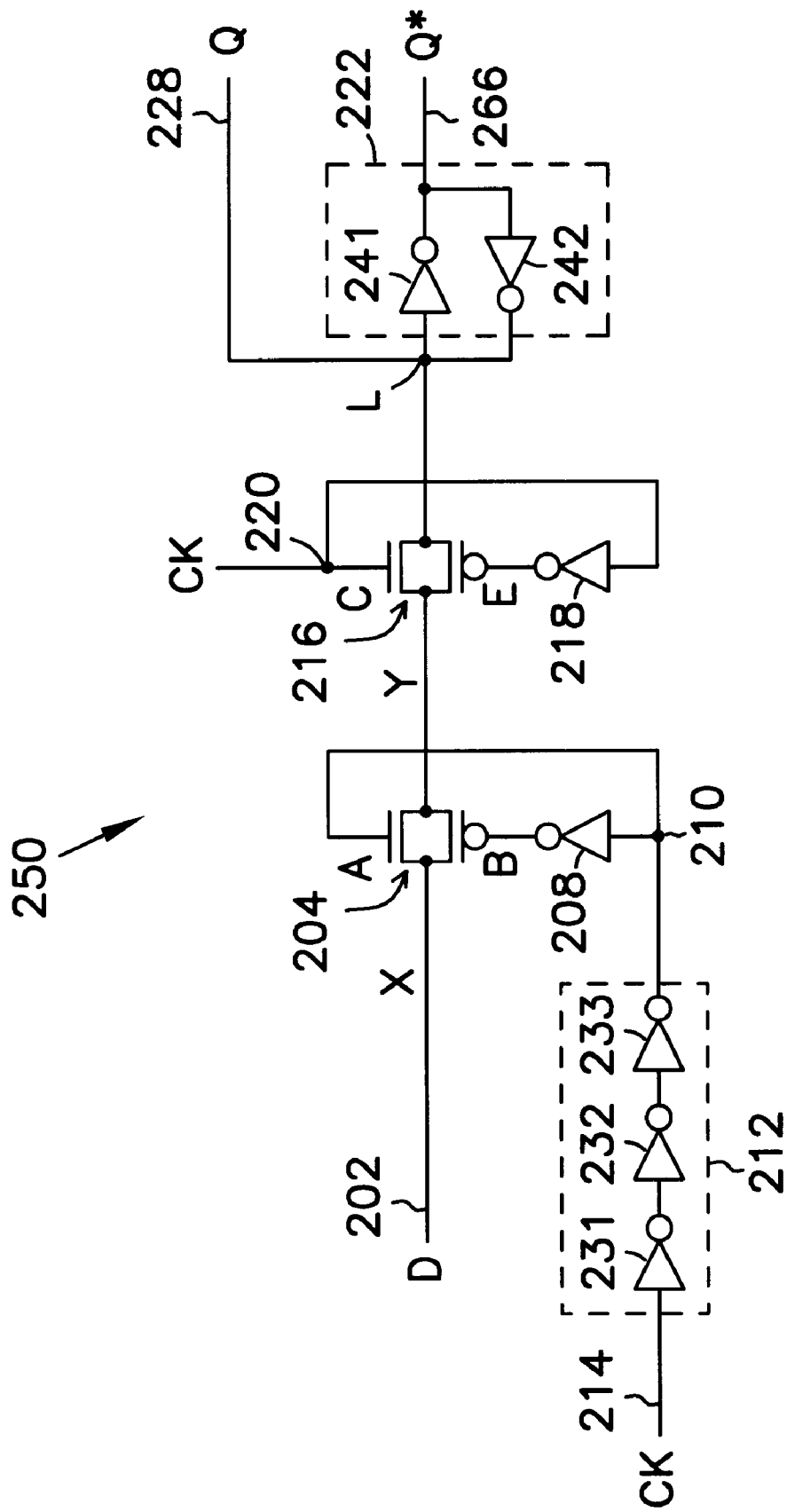
FIG. 2B is a flip-flop according to another embodiment of the invention.

FIG. 2B is a flip-flop according to another embodiment of the invention. flip-flop 250 of FIG. 2B is the same as flip-flop 200 of FIG. 2A with the exception of the absence of inverters 206 and 226. In flip-flop 250, signal Q is provided directly by latch node L, and signal Q* is provided on node 266 of memory unit 222. In general, function of flip-flop 250 is the same as the function of flip-flop 200. In an integrated circuit, both flip-flops 200 and 250 can be used to receive a data signal at node 202 from a different circuit and to provide output signals Q and Q* to another circuit. However, flip-flops 200 or 250 can be selected according to specific application of the integrated circuit where the flip-flop resides to provide efficient operation. For example, if a load connected to receive signal Q or Q* is relatively small in comparison to the drive capability of the flip-flop, then flip-flop 250 can be used. Flip-flop 250 in this situation can be very fast because it has fewer components.

Figure 3:
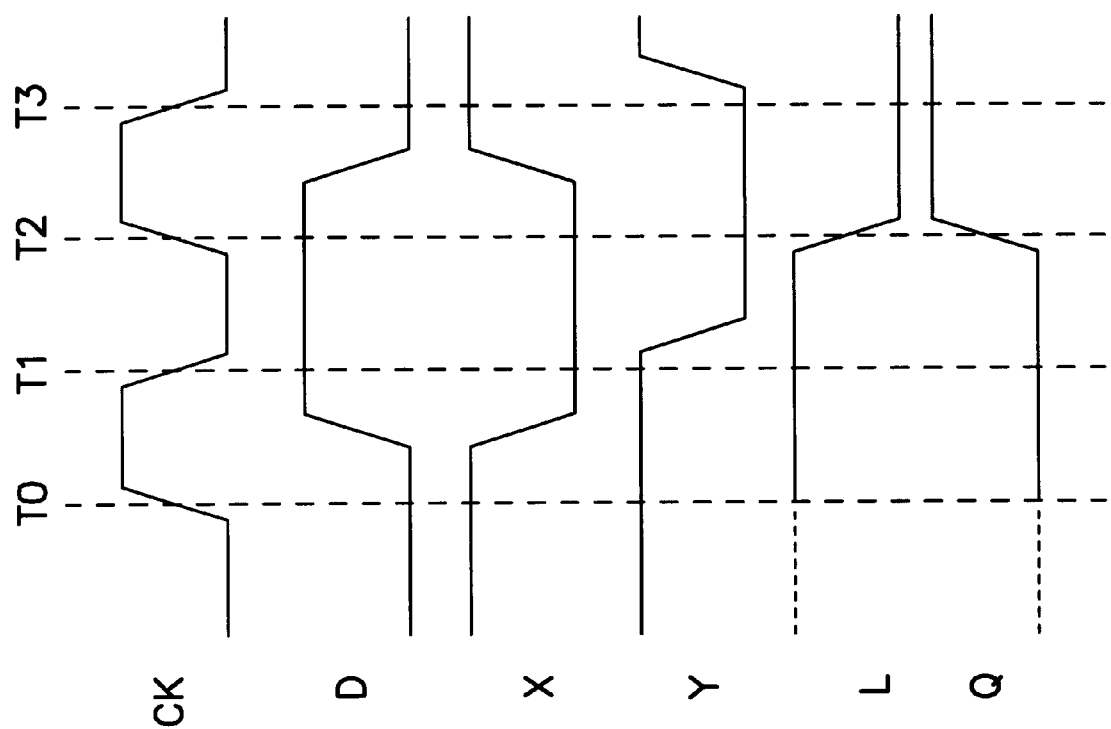
FIG. 3 is a timing diagram of the operation flip-flop of FIG. 2A.

FIG. 3 is a timing diagram of the operation flip-flop 200 of FIG. 2A. Signal CK represents a clock signal at nodes 214 and 220. Signal D is the input signal at node 202. Rising and falling edges of signal D are shown as an example to illustrate the operation of flip-flop 200. However, the rising and falling edges can occur at different times. Other signals, X, Y, L and Q are the signals at their corresponding nodes shown in FIG. 2A.

Before time T0, or before the rising edge of CK signal (before CK signal makes a transition from low to high,) transmission gate 204 is on and transmission gate 216 is off. When transmission gate 204 is on, signal on node Y follows signal on node X; both signals are at the same high signal level. The signal at node L and output signal Q at this time are not affected by signal at node Y because transmission gate 216 is off. Thus, at this time signals at nodes L and Q can be at a low signal level (LOW) or at high signal level (HIGH), which is the level before T0. In FIG. 3, the signal levels of L and Q before T0 are assumed to be the levels indicated by dashed lines.

At time T0, CK signal makes a transition to HIGH, which turns on transmission gate 216. At this time, transmission gate 204 is still on and will be off after a time delay equal to the time delay of delay circuit 212. When transmission gate 216 is on while transmission gate 204 is still on, data signal D propagates to node X, then to node Y, and to latch node L. Subsequently, data signal D becomes output signal Q or Q* at node 228 or 230. As shown in FIG. 3, the signals at nodes X, Y and L are at the same level at this time. After the time delay, transmission gate 204 turns off. When transmission gate 204 is off, changes in data signal D do not affect signals at nodes Y and L; thus, output signals Q and Q* are also not affected.

At time T1, CK signal makes a transition to LOW, which turns off transmission gate 216. Transmission gate 204 will turn on after a time delay from delay circuit 212. Since transmission gate 204 is on, the signal at node Y follows the signal at node X, which is the inversion of input signal D. In FIG. 3, the signal at node Y switches from HIGH to LOW to reflect the signal at node X, which is LOW at this time. Even though the signal at node Y changes, the signal at latch node L remains the same, because transmission gate 216 is off. Consequently, signal Q also remains unchanged.

At time T2, the operation of flip-flop 200 is the same as the operation of the flip-flop at time T0. At time T3, the operation of flip-flop 200 is the same as the operation of the flip-flop at time T1. In general, when CK signal switches to HIGH (at the rising clock edge), transmission gate 216 is on allowing data signal D, previously residing at node Y, to pass to output node 228. When CK switches to LOW (falling clock edge), transmission gate 216 is off, which disconnects output node 228 from node Y and keeps signal Q at the same signal level. Transmission gate 204 is controlled by one phase of clock signal CK (when clock signal CK is LOW) to let data signal D to pass from node X to node Y. Transmission gate 216 is controlled by another phase of the clock signal (when clock signal CK is HIGH) to let data signal D to pass from node Y to node L.

Figure 4A:
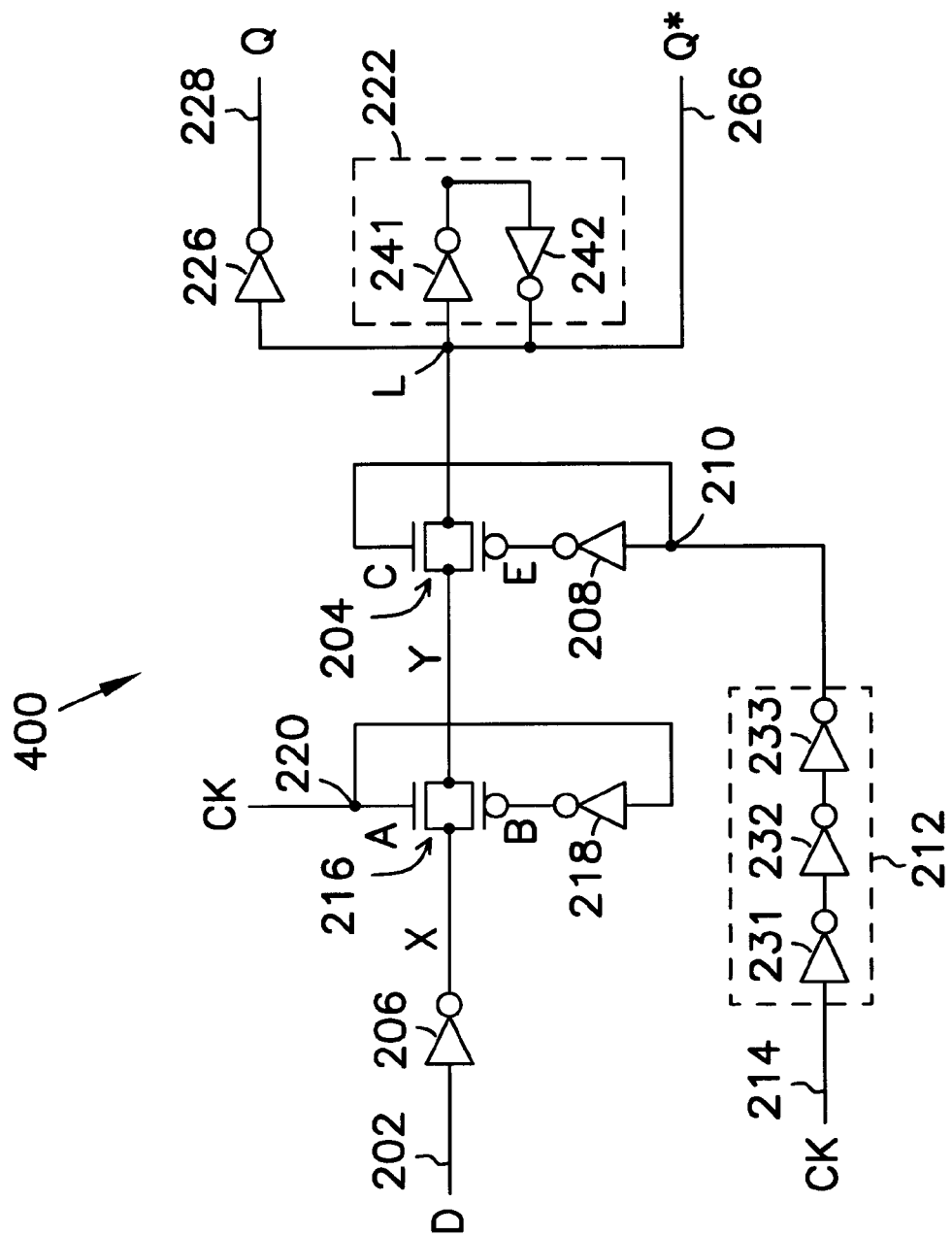
FIGS. 4A–B are flip-flops according to another embodiment of the invention.
Figure 4B:
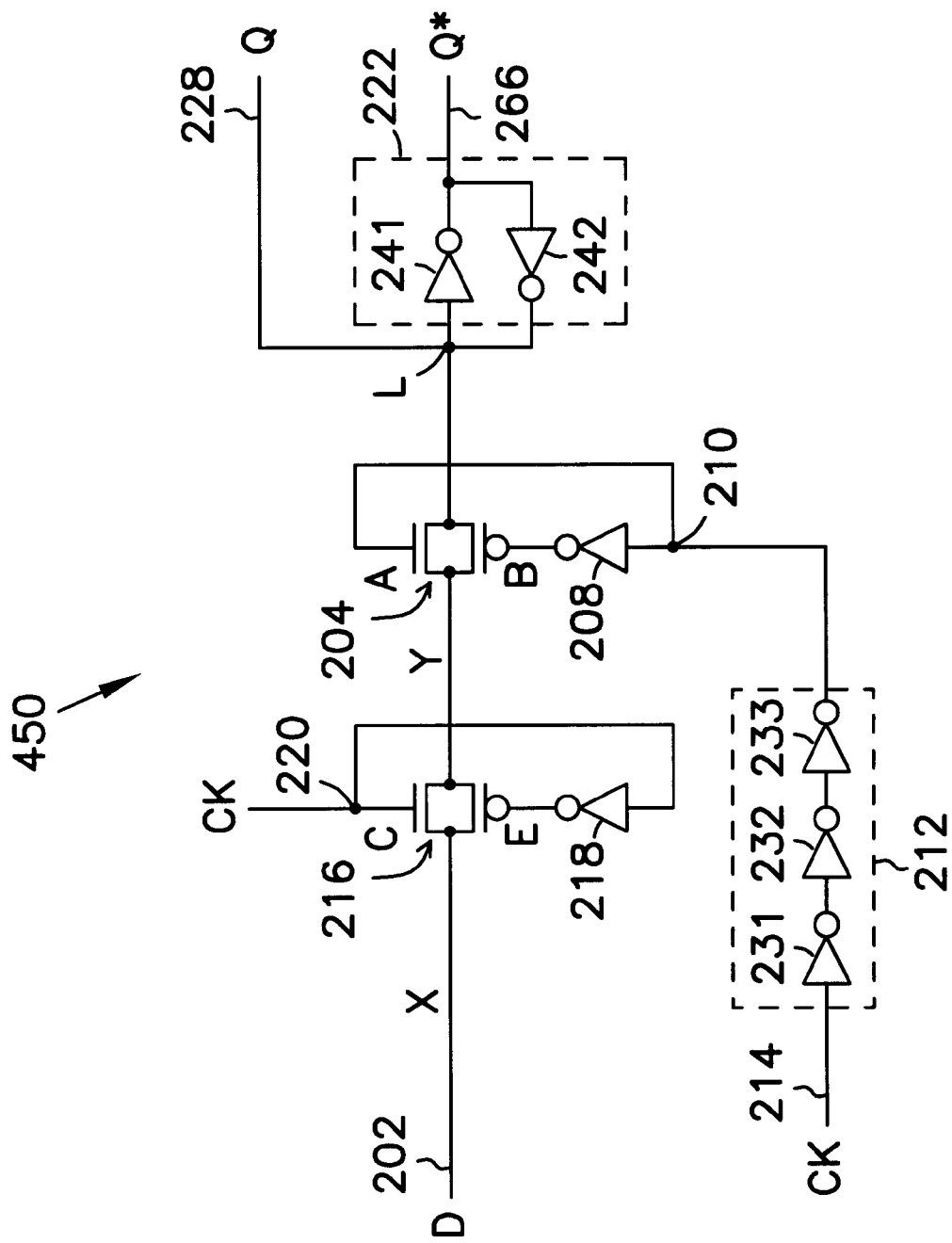

FIGS. 4A–B are flip-flops according to other embodiments of the invention. In FIG. 4A, flip-flop 400 is the same as flip-flop 200 except that the positions of transmission gate 204 and 216 are switched. Even arranged as in FIG. 4A, the operation of flip-flop 400 is the same as the function of flip-flop 200 of FIG. 2A, except that flip-flop 200 is a negative-edged-triggered flip-flop and flip-flop 400 is a positive-edged-triggered flip-flop.

FIG. 4B is another embodiment of flip-flop 400 of FIG. 4A. In FIG. 4B, flip-flop 450 is the same as flip-flop 400 except that inverters 206 and 266 are removed. The function of flip-flop 450 is the same as the operation of flip-flop 400. However, flip-flop 450 operates faster than flip-flop 400 because it has fewer components. Flip-flop 450 can be used where a load connected to output signals Q and Q* is relatively small.

Figure 5A:
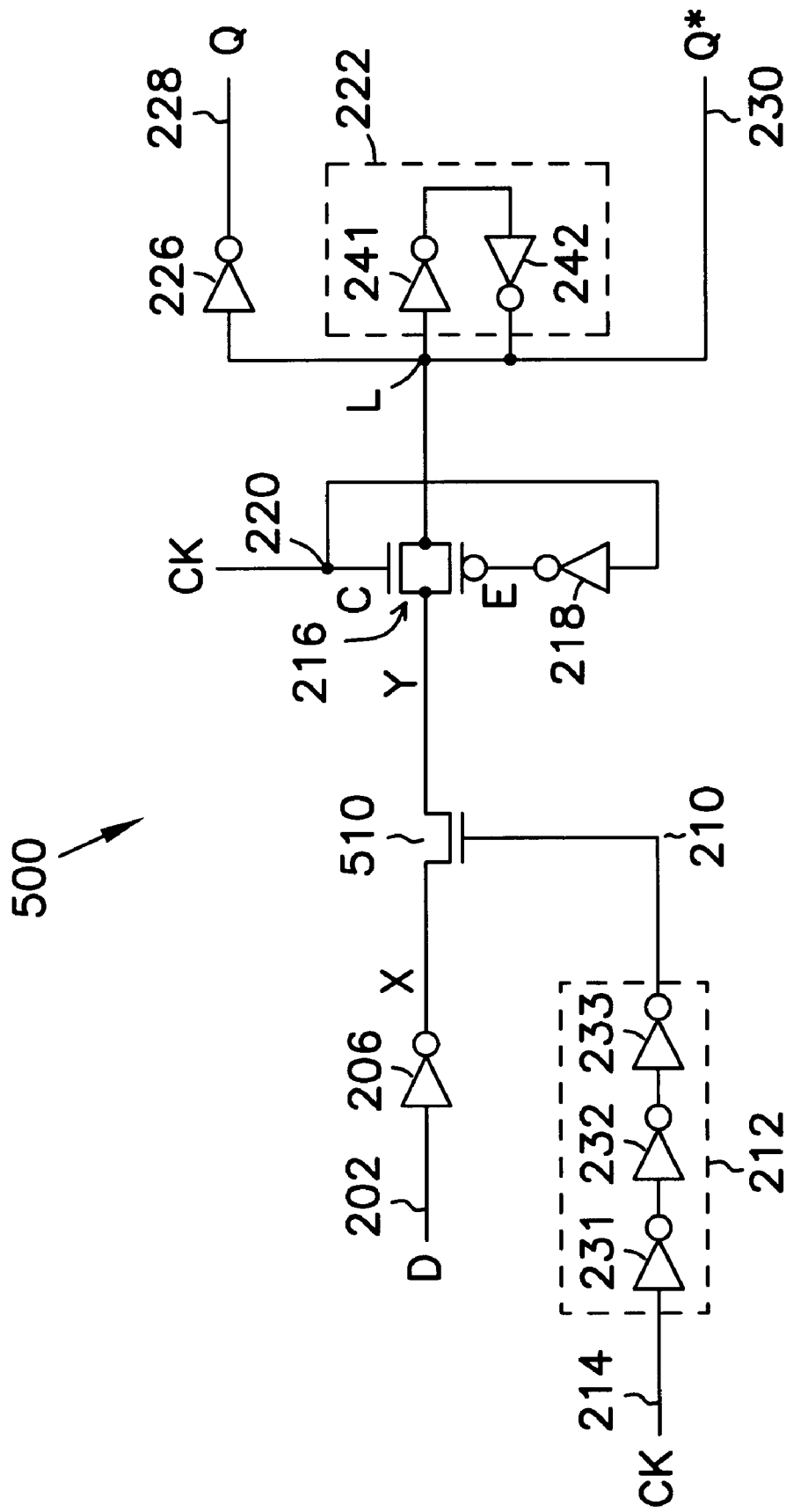
FIGS. 5A–B are flip-flops according to another embodiment of the invention.
Figure 5B:
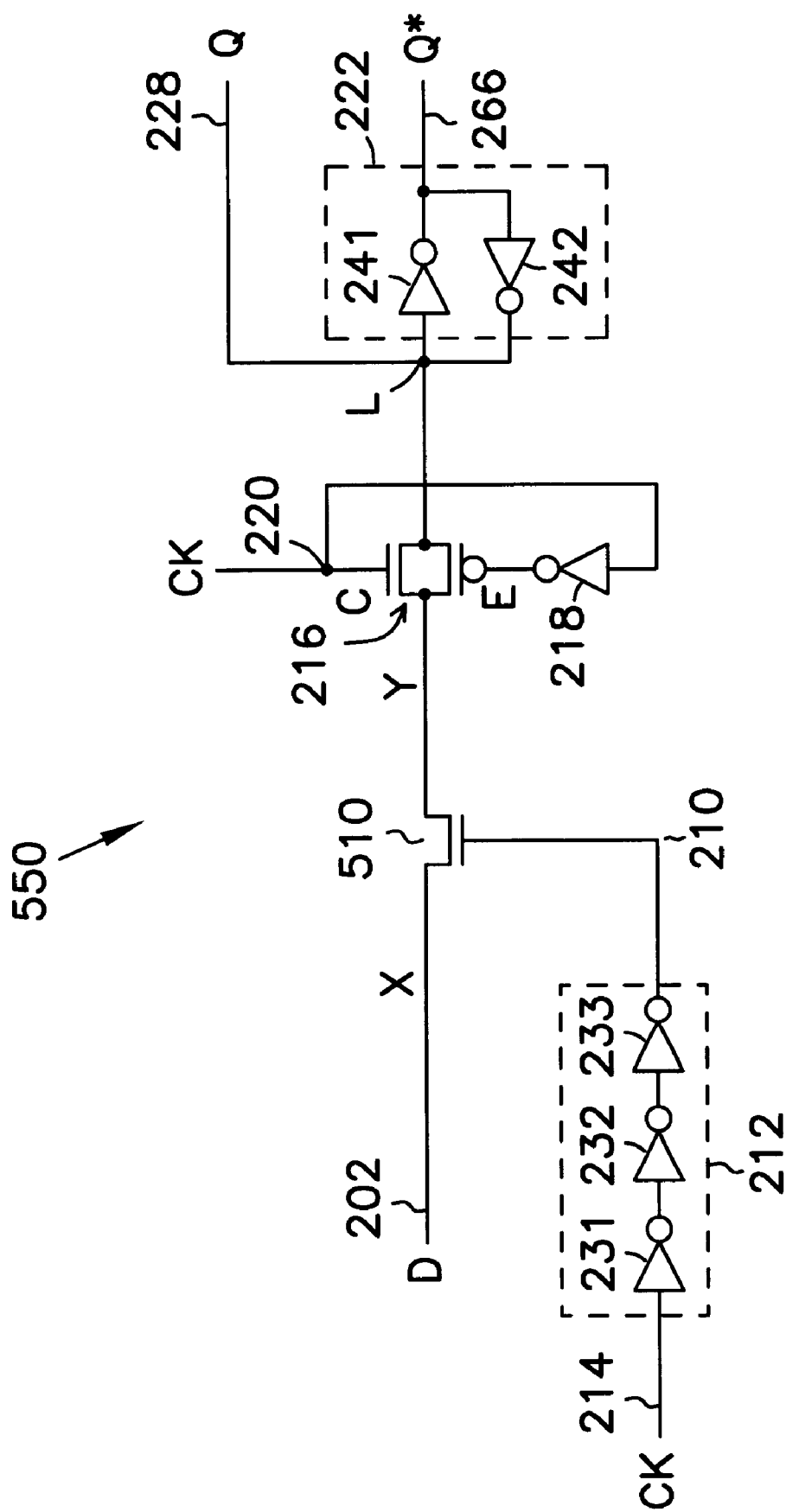

FIGS. 5A–B are flip-flops according to other embodiments of the invention. In FIG. 5A, flip-flop 500 is the same as flip-flop 200 except that transmission gate 204 is replaced by an NMOS transistor 510. Transistor 510 connects, in series, to transmission gate 216. In FIG. 5B, flip-flop 550 is the same as flip-flop 500 except that inverters 206 and 226 are removed. The operation of flip-flops 500 or 550 is the same as the function of flip-flop 200.

Figure 6A:
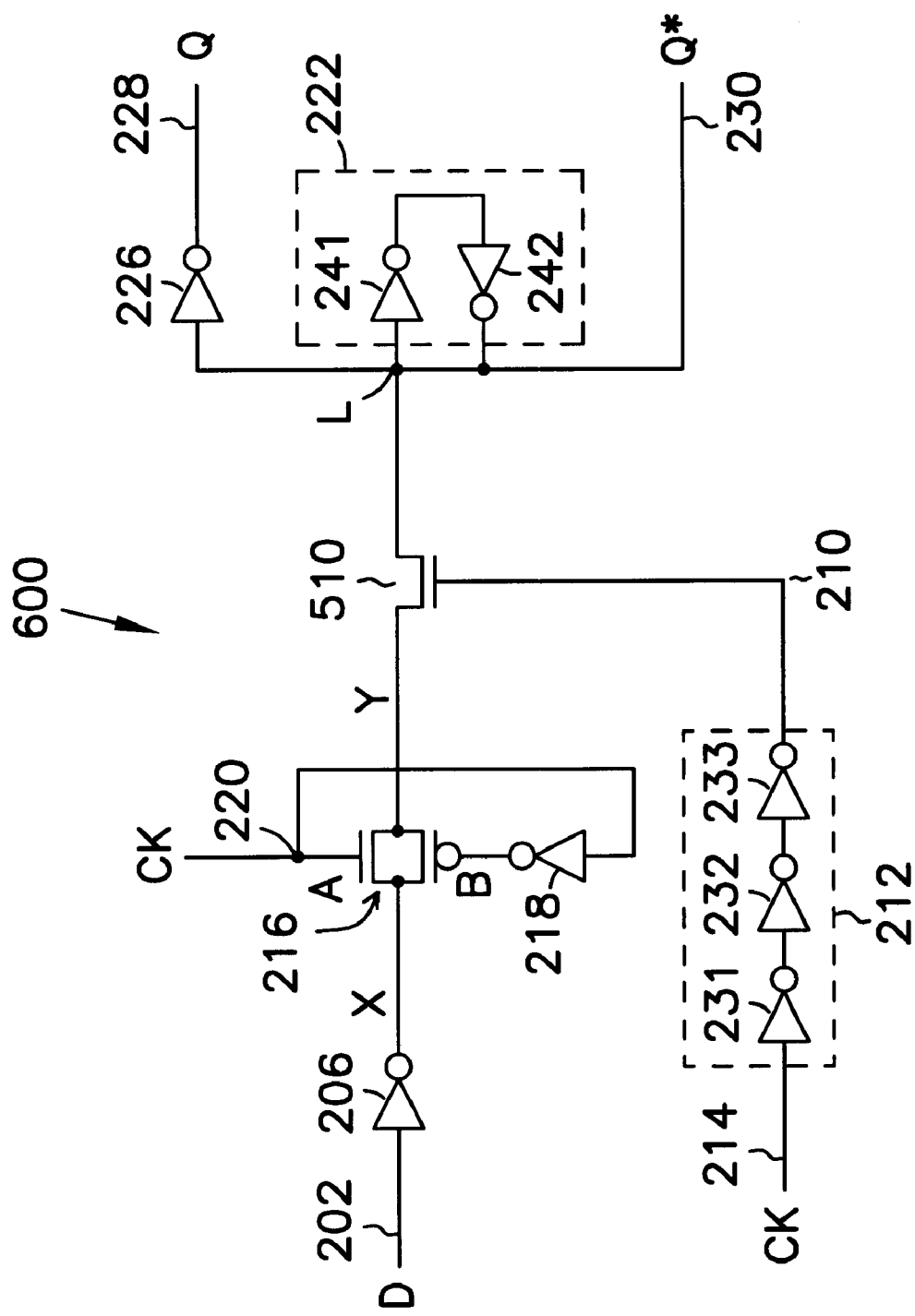
FIGS. 6A–B are flip-flops according to another embodiment of the invention.
Figure 6B:
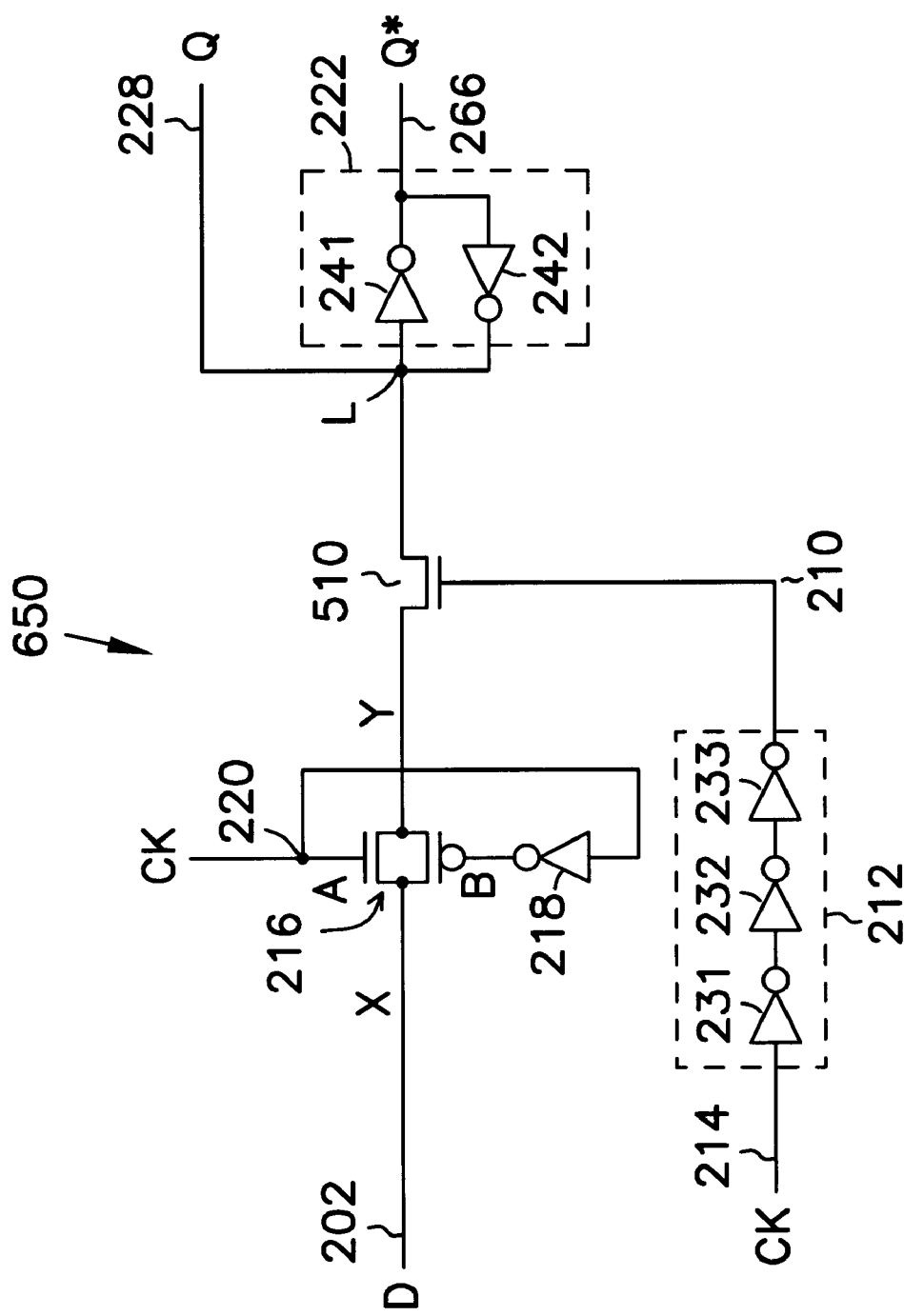

FIGS. 6A–B are flip-flops according to other embodiments of the invention. In FIG. 6A, flip-flop 600 is the same as flip-flop 500 except the positions of NMOS transistor 510 and transmission gate 216 are switched. In FIG. 6B, flip-flop 650 is the same as flip-flop 600 except that inverters 206 and 226 are removed. The function of flip-flops 600 or 650 is the same as the function of flip-flop 500.

Following the patterns of the flip-flops of FIGS. 4A–6B, other embodiments or arrangements of flip-flop similar to any of the flip-flops described above can be produced. For example, a flip-flop similar to flip-flops of FIGS. 5A–6B can be produced by replacing NMOS transistor 510 with a PMOS transistor and changing the number of inverters of delay circuit 212 from an odd number to an even number.

As described in FIGS. 2A–6B, the pass element of the flip-flops, such as flip flop 200 or flip-flop 500, is a transmission gate or a series transistor. For example, in FIG. 2A, both pass elements of flip-flops 200 are transmission gates (204 and 216.) In FIG. 5A, one of the pass elements is a transistor (510.) In either case, the "pass element" is defined to be a single element, which is connected to pass a signal in a series fashion. The signal is passed from one source/drain to another source/drain of the pass element. The passage of the signal passing through the pass element is controlled by the gate of the pass element, and not dependant on other elements connected to it.

Figure 7B:
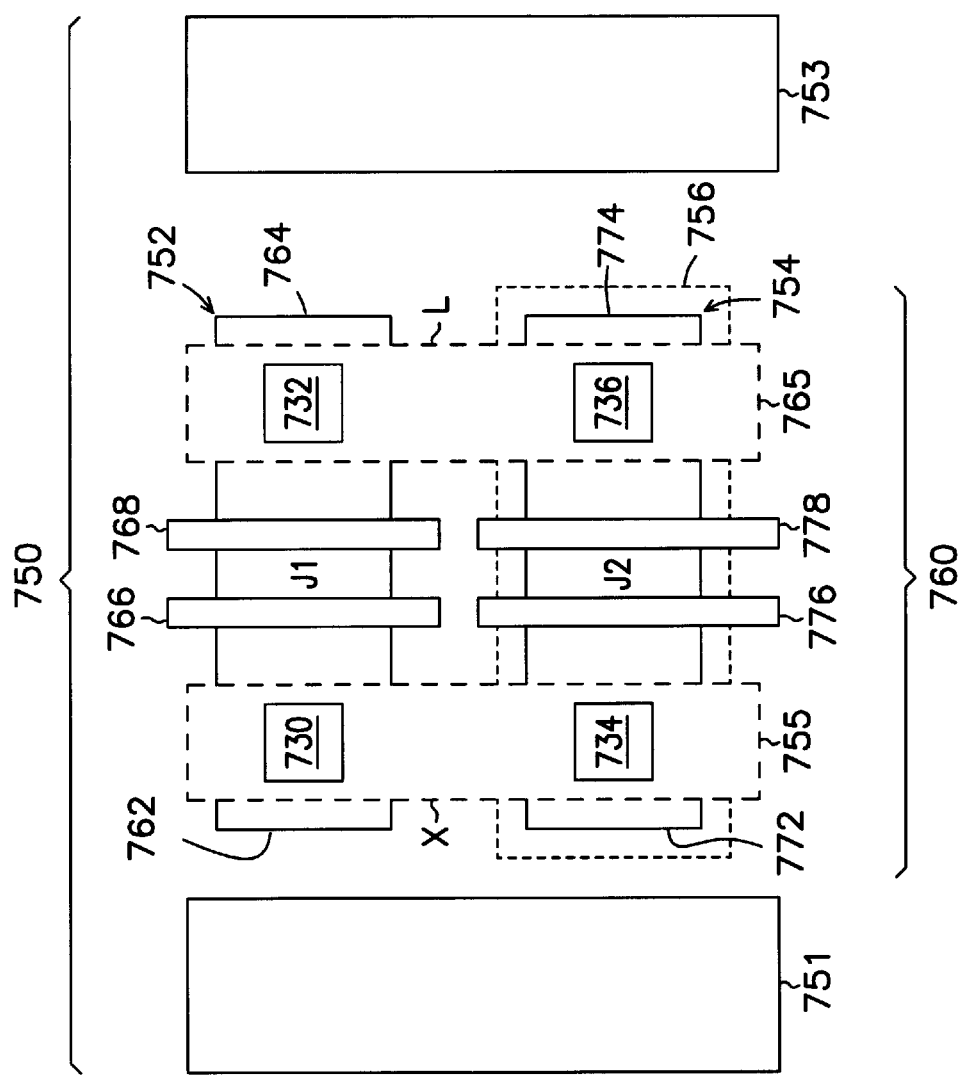
FIG. 7B is a layout of a flip-flop including a layout area for the transmission gates of FIG. 7A.
Figure 7A:
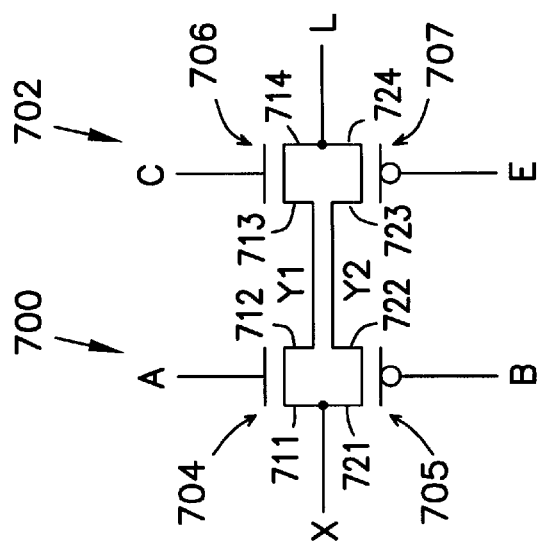
FIG. 7A is a schematic diagram illustrating another embodiment of the transmission gates of the flip-flop of FIG. 2A or 2B.

FIG. 7A is a schematic diagram illustrating another embodiment of the transmission gates of the flip-flop of FIG. 2A or 2B. In the Figure, transmission gates 700 and 702 are the same as transmission gates 204 and 216 except that transmission gates 700 and 702 include separate internal nodes Y1 and Y2, whereas transmission gates 204 and 216 have nodes Y1 and Y2 connected as one Y node. Transmission gate 700 includes an N-channel transistor 704 and a P-channel transistor 705. Transmission gate 702 includes an N-channel transistor 706 and a P-channel transistor 707. N-channel transistor 704 has source/drain regions 711 and 712. P-channel transistor 705 has source/drain regions 721 and 722. N-channel transistor 706 has source/drain regions 713 and 714. P-channel transistor 707 have source/drain regions 723 and 724. The function of transmission gates 700 and 702 and the function of transmission gates 204 and 216 are the same. However, a separate Y1 and Y2 node provides an advantage in the layout for the construction of transmission gate 700 and 702 over the layout for the construction of transmission gates 204 and 216.

FIG. 7B is a layout 750. Layout 750 can be used to construct flip-flop 200 or 250 of FIG. 2A or 2B. Layout 750 includes layout areas 760, 751 and 753. Layout area 760 is the layout area for the transmission gates 700 and 702 of FIG. 7A. Layout areas 751 and 753 are the layout areas for other elements or components of the flip-flop, such as flip-flop 200. For example, layout 751 can be used to form connections for signals D and CK, and delay circuit 212. Layout area 753 can be used to form memory unit 222 and connections for signals Q and Q*. Layout areas 751 and 753 are shown as separate areas, however, they can be combined into a single layout area. In FIG. 7B, layout area 760 is shown in more details than layout areas 751 and 753 to emphasis the advantage of layout area 760.

As shown by layout area 760, the size required to construct transmission gate 700 and 702 is smaller than the size required to construct transmission gates 204 and 206. In FIG. 7B, layout 750 includes first and second source/drain regions 752 and 754. Source/drain region 754 is contained in an N-well region 756. Source/drain region 752 is a layout of source/drains 711–714 of n-channel transistors 704 and 706 of FIG. 7A. Source/drain region 754 is a layout of source/drains 721–724 of p-channel transistors 705 and 707 of FIG. 7A. Source/drain region 752 has first and second ends 762 and 764. A first contact 730 is located near first end 762, and a second contact 732 is located near second end 764. A first and second gate contacts 766 and 768 are located between first and second contacts 730 and 732. Gate contacts 766 and 768 represent gates A and C of FIG. 7A, respectively. A space between the first and second gate contacts 766 and 768 forms an area or junction J1. Junction J1 represents Y1 of FIG. 7A. Junction J1 has a width which is smaller than a width of contact 730 or 732.

Source/drain region 754 has first and second ends 772 and 774. A first contact 734 is located near first end 772, and a second contact 736 is located near second end 774. First and second gate contacts 776 and 778 are located between first and second contacts 734 and 736. Gate contacts 776 and 778 represent gates B and D of FIG. 7A, respectively. A space between the first and second gate contacts 766 and 768 forms an area or junction J2. Junction J2 represents Y2 of FIG. 7A. Junction J2 has a width which is smaller than a width of contact 734 or 736.

A first metal contact 755 connects both first contacts 730 and 734 to form node X of FIG. 7A. A second metal contact 765 connects both second contacts 732 and 736 to form node L of FIG. 7A.

As seen in FIG. 7A, nodes Y1 and Y2 are not connected, thus, no contacts are required at Y1 and Y2 to connect them together. Therefore, the width of junction J1 and J2 do not have to be as wide as the width of contact 730, 732, 734 or 726. Thus, J1 and J2 can be formed in a relatively smaller area or junction which has a smaller width than the width of the contact. In FIG. 2A or 2B, J1 and J2 must be formed in an area having a width at least equal to the width of the contact, to allow an insertion of a contact at J1 and J2 so that a metal connector can connect the contacts at J1 and J2 to form a single node Y. Thus, by having separate junctions J1 and J2, layout of the junctions can be formed in a smaller area, which results in a smaller size of the whole flip-flop.

Besides a smaller size provided by layout 750, the capacitance of Y1 and Y2 of FIG. 7A is smaller than the capacitance of a single node Y of FIG. 2A or 2B, because Y1 and Y2 are formed in a smaller area than the area of single node Y. The smaller capacitance is advantageous because less time is required to charge node Y1 or Y2 than node Y. Therefore, any flip-flop described above can operate faster if it is constructed using layout 750.

Figure 8:
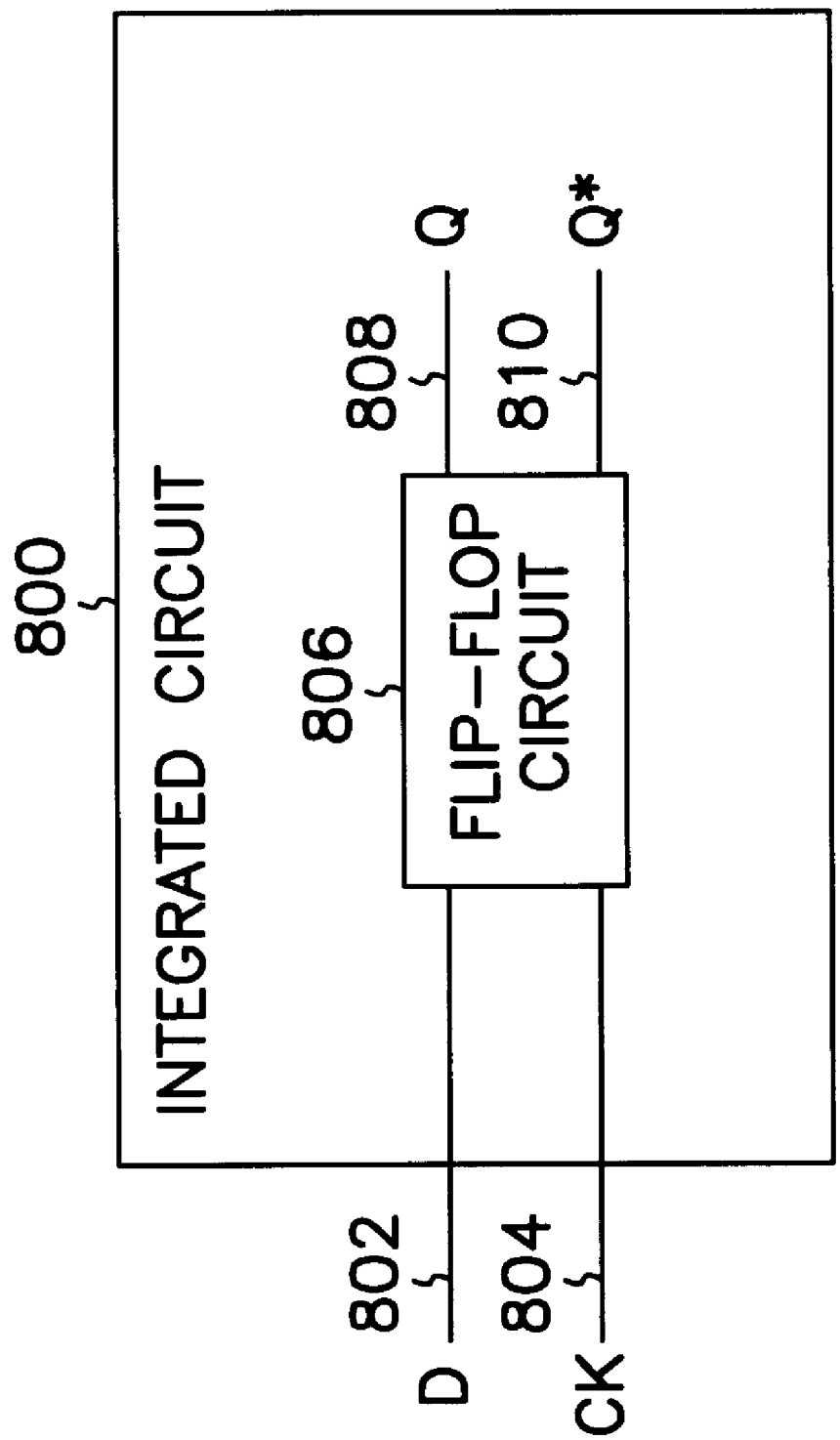
FIG. 8 is a block diagram of an integrated circuit having a flip-flop of the invention.

FIG. 8 illustrates a block diagram of an integrated circuit 800 of the present invention. Integrated circuit 800 includes a first input connection 802 to receive a clock signal CK, and at least one other input connection 804 to receive a data signal D. Clock signal CK and data signal D can be coupled to an internal flip-flop circuit 806 for processing by internal circuitry. Flip-flop circuit 806 produces output signals Q at output node 808 and Q* at node 810. Flip-flop circuit 806 can be arranged as any flip-flop described above with respect to FIGS. 2A–6B. Integrated circuit 800 can be any type of integrated circuit, including but not limited to a processor, memory, memory controller, or application-specific integrated circuit (ASIC).

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A flip-flop comprising:
   a data input node to receive a data signal;
   a first pass element connected to the data input node, and controlled by one phase of a clock signal, wherein the first pass element includes a plurality of source terminals and a plurality of drain terminals and only two of the source and drain terminals connect directly together;
   a second pass element connected to the first pass element at a first internal node and at a second internal node separated from the first internal node, and controlled by another phase of the clock signal, wherein the second pass element includes a plurality of source terminals and a plurality of drain terminals and only two of the source or drain terminals connect directly together;
   a plurality of inverters connected to a selected pass element among the first and second pass elements to delay the clock signal to the selected pass element by more than two inverters delay; and
   a memory unit connected to the second pass element to provide an output signal to an output node.

2. The flip-flop of claim 1, wherein the output signal follows the data signal after the clock signal makes a transition.

3. The flip-flop of claim 1, wherein the memory unit includes a plurality of inverters to provide another output signal to a second output node.

4. The flip-flop of claim 1, wherein the first and second pass elements are transmission gates.

5. A flip-flop comprising:

a data input node to receive a data signal;

a first transmission gate connected to the data input node, and controlled by one phase of a clock signal, wherein the first transmission gate includes an n-channel and a p-channel transistor;

a second transmission gate controlled by another phase of the clock signal and including an n-channel and a p-channel transistor, wherein the n-channel transistors of the first and second transmission gates connect directly together at a first internal node, and the p-channel transistors. of the first and second transmission gates connect directly together at a second internal node, the second internal node being different from the first internal node;

a plurality of inverters connected to a selected transmission gate among the first and second transmission gates to provide a delay of the clock signal such that there is a first delay between activation of the n-channel transistors of the first and second transmission gates and there is a second delay between activation of the p-channel transistors of the first and second transmission gates, the first delay being equal to the second delay and each of the first delay and the second delay being greater than one inverter delay; and a memory unit connected to the second transmission gate to provide an output signal to an output node.

6. The flip-flop of claim 5, wherein the memory unit includes a plurality of inverters to provide another output signal to a second output node.

7. A flip-flop comprising:

a first stage having a first pass element to receive a data signal from an input node, and controlled by one phase of a clock signal the first pass element including a plurality of source terminals and a plurality of drain terminals and only two of the source or drain terminals connect directly together;

a second stage connected to the first stage at a first internal node and at a second internal node separated from the first internal node, controlled by another phase of the clock the signal second stage having a second pass element to transfer the data signal to a memory unit, the second pass element including a plurality of source terminals and a plurality of drain terminals and only two of the source or drain terminals connect directly together;

and a plurality of inverters connected to a selected stage among the first and second stages to delay the clock signal to the selected stage by more than two inverters delay.

8. The flip-flop of claim 7, wherein both pass elements are transmission gates.

9. The flip-flop of claim 7, wherein the memory unit includes inverters to provide complementary output signals.

10. An integrated circuit comprising:

a first input connection to receive a data signal;

a second input connection to receive a clock signal; and a flip-flop connected to receive the data signal and the clock signal, the flip-flop comprising:

a first stage having first pass element to receive the data signal and, the clock signal, and controlled by one phase of the clock signal, the first pass element including a plurality of source terminals and a plurality of drain terminals and only two of the source or drain terminals connect directly together;

a second stage connected to the first stage at a first internal node and at a second internal node separated from the first internal node, and controlled by another phase of the clock signal, the second stage having a second pass element to transfer the data signal to a memory unit, the second pass element including a plurality of source terminals and a plurality of drain terminals and only two of the source or drain terminals connect directly together, wherein the memory unit provides complementary output signals; and a plurality of inverters connected to a selected stage among the first and second stages to delay the clock signal to the selected stage by more than two inverters delay.

11. The integrated of claim 10, wherein the first and second pass elements are transmission gates.

\* \* \* \* \*